(12) United States Patent
Higashiyama (10) Patent No.: US 7,291,912 B2
(45) Date of Patent: Nov. 6, 2007

(54) CIRCUIT BOARD

(75) Inventor: Tsuyoshi Higashiyama, Takefu (JP)

(73) Assignee: Orion Electric Co., Ltd., Fukui (JP)

( * ) Notice: Subject to any disclaimer, the term of this patent is extended or adjusted under 35 U.S.C. 154(b) by 239 days.

(21) Appl. No.: 11/073,846

(22) Filed: Mar. 8, 2005

(65) Prior Publication Data

US 2005/0200010 A1    Sep. 15, 2005

(30) Foreign Application Priority Data

Mar. 9, 2004    (JP)    ............... 2004-065100

(51) Int. Cl.
*H01L 23/12* (2006.01)
*H01L 23/14* (2006.01)
(52) U.S. Cl. .............. 257/701; 257/702; 257/723; 257/E23.007
(58) Field of Classification Search ........ 257/701, 257/702, 723, 692, E23.007
See application file for complete search history.

(56) References Cited

U.S. PATENT DOCUMENTS 4,493,145 A * 1/1985 Honda ................ 29/840
6,803,514 B2 * 10/2004 Takeyama ............ 136/251
6,902,102 B2 * 6/2005 Tanabe et al. ........ 228/260

FOREIGN PATENT DOCUMENTS

| JP | 05-110242 A | 4/1993 |
| JP | 05-36871 U | 5/1993 |
| JP | 05-327196 A | 12/1993 |
| JP | 7-3158 | 1/1995 |

OTHER PUBLICATIONS

Office Action dated May 29, 2007 issued in corresponding Japanese Application No. 2004-065100.

* cited by examiner

*Primary Examiner*—Nitin Parekh
(74) *Attorney, Agent, or Firm*—Westerman, Hattori, Daniels & Adrian, LLP.

(57) ABSTRACT

The present invention provides a circuit board which prevents an adverse effect to be caused on electronic components by flux or the like that is produced at the time of soldering. According to this invention, land patterns 6 and 7 for connecting a flat cable 5 and a slide switch 4 are formed apart from each other on a circuit board and a slit 10 is formed between the land patterns 6 and 7. Consequently, although flux is produced when terminals 5a to 5f of the flat cable 5 are soldered to the land pattern 7, the flux can escape from the slit 10 and does not intrude into the slide switch 4 easily.

3 Claims, 9 Drawing Sheets

CIRCUIT BOARD

The present application is based on and claims priority of Japanese patent application No. 2004-065100 filed on Mar. 9, 2004, the entire contents of which are hereby incorporated by reference.

BACKGROUND OF THE INVENTION

1. Field of the Invention

The present invention relates to a circuit board that has land patterns for soldering terminals of electronic components, and in particular, to a circuit board that is adapted to prevent an adverse effect caused on an electronic component due to flux and the like that are produced at the time of soldering.

2. Description of the Related Art

In general, when various electronic components are mounted on a circuit board, a wiring pattern is formed on the circuit board and terminals of the electronic components are soldered to land patterns of this wiring pattern. In such a soldering process, for the purpose of securing wettability between the land patterns of the circuit board and the terminals of the electronic components and realizing satisfactory soldering, for example, soldering processing is performed by applying flux to the circuit board or using solder containing flux. However, since the flux consists of water and active components and has a water absorption property and a moisture absorption property, when the flux intrudes into the electronic components, the flux changes to a film having a hydrophilic nature. This film acts as a medium for an electrochemical reaction to result in causing a failure such as deterioration in insulation due to electrolytic etching. As a conventional measure for preventing such a failure due to the flux, Japanese Utility Model Laid-Open Publication No. 07-003158 proposes a circuit board that is constituted to control intrusion of a foreign material such as flux into electronic components mounted on a circuit board by forming a hole in the bottom surface of an electronic component such as a surface wave filter on the circuit board and permitting the foreign material such as the flux, which is produced at the time of soldering, to escape from the hole.

In recent years, various electronic devices tend to be reduced in size and thickness. In addition, a circuit board further reduced in size is demanded as a circuit board to be built in the electronic devices. Thus, in recent years, electronic components to be mounted on the circuit board tend to be mounted more densely. Consequently, in the case in which a distance between two electronic components is short, and for example, a wiring member such as a flat cable is soldered to be connected to the electronic components after the circuit board is manufactured, when other electronic components are mounted near a land pattern of the flat cable, it is likely that flux, which is produced at the time of the soldering of the flat cable, directly intrudes into the electronic components near the land pattern. In such a case, even if a hole is formed in the bottom surface of an electronic component as described in the Japanese Utility Model Laid-Open Publication No. 07-003158, it is difficult to effectively prevent the flux that is produced at the time of soldering of the flat cable to be attached to the circuit board after the circuit board is manufactured.

SUMMARY OF THE INVENTION

The invention has been devised in view of the problems described above, and it aims at providing a circuit board on which plural electronic components are mounted to be adjacent to one another, in which flux, a foreign material, heat, or the like, which travels from one electronic component to other electronic components at the time of a soldering process of the electronic component, does not travel easily.

A circuit board according to the first aspect of the invention is a circuit board on which land patterns for soldering terminals of plural electronic components to the circuit board are provided apart from one another, wherein the openings are provided among the respective land patterns.

According to this arrangement, when other electronic components are soldered on to the circuit board, on which the electronic components are mounted after the circuit board is manufactured, flux, a foreign material, heat, or the like produced at the time of the soldering escapes from the openings and does not directly intrude into the other electronic components mounted on the circuit board easily.

A circuit board according to the second aspect of the invention is a circuit board on which land patterns for soldering terminals of plural electronic components to the circuit board are provided apart from one another, wherein the openings, which are located among the respective land patterns are provided to permit flux produced at the time of the soldering of the land patterns to escape.

According to this arrangement, when other electronic components are soldered on to the circuit board, on which the electronic components are mounted after the circuit board is manufactured, flux produced at the time of the soldering escapes from the openings and does not intrude into the electronic components mounted on the circuit board easily. Consequently, it is possible to prevent failures such as electrolytic etching and deterioration in insulation due to the flux.

A circuit board according to the third aspect of the invention is that, in the circuit board according to the first or the second aspect of the invention, the electronic components include plural terminals, respectively, and the openings are provided so as to at least cross imaginary lines connecting the terminals closest to one another among the respective electronic components.

According to this arrangement, since the openings are provided in positions to which flux, a foreign material, or heat travels most easily, the flux, the foreign material, or the heat can be set not to travel to the electronic components easily. In addition, if a length of the openings is set to a necessary minimum length, it is possible to use the circuit board effectively as a mounting space for the electronic components and mount the electronic components at a high density.

According to the circuit board according to the first aspect of the invention, in the circuit board on which land patterns for soldering terminals of plural electronic components to the circuit board are provided apart from one another, the openings are provided among the respective land patterns. Thus, it is possible to prevent an adverse effect caused on the electronic components due to flux, a foreign material, or heat that is produced at the time of the soldering.

According to the circuit board according to the second aspect of the invention, in the circuit board on which land patterns for soldering terminals of plural electronic components to the circuit board are provided apart from one another, the openings, which are disposed among the respective land patterns, are provided to permit flux produced at the time of the soldering of the land patterns to escape. Thus, it is possible to prevent failures such as electrolytic etching and deterioration in insulation due to the flux produced at the time of the soldering.

According to the circuit board according to the third aspect of the invention, in the circuit board according to the first or the second aspect invention, the electronic components include plural terminals, respectively, and the openings are provided so as to at least cross imaginary lines connecting terminals closest to one another among the respective electronic components. Thus, it is possible to prevent an adverse effect caused on the electronic components due to flux, a foreign material, or heat. In addition, by setting a length of the openings to a necessary minimum length, it is possible to effectively use the circuit board as amounting space for the electronic components and reduce a size of the circuit board by mounting the electronic components at a high density.

DETAILED DESCRIPTION OF THE PREFERRED EMBODIMENTS

Now, a preferred embodiment for carrying out the invention will be hereinafter explained with reference to the accompanied drawings.

Figure 1:
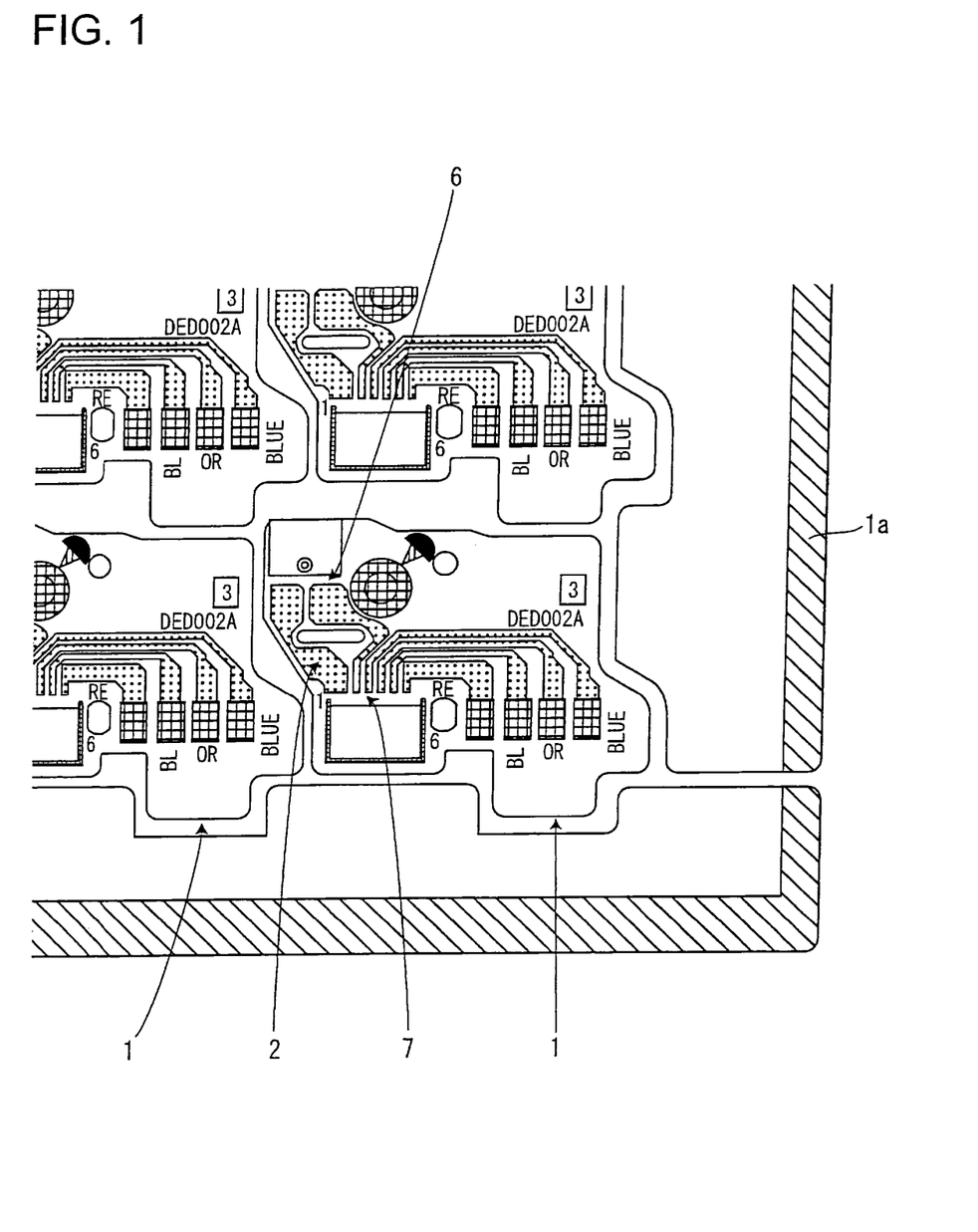
FIG. 1 is a front view of a circuit board of the invention.
Figure 2:
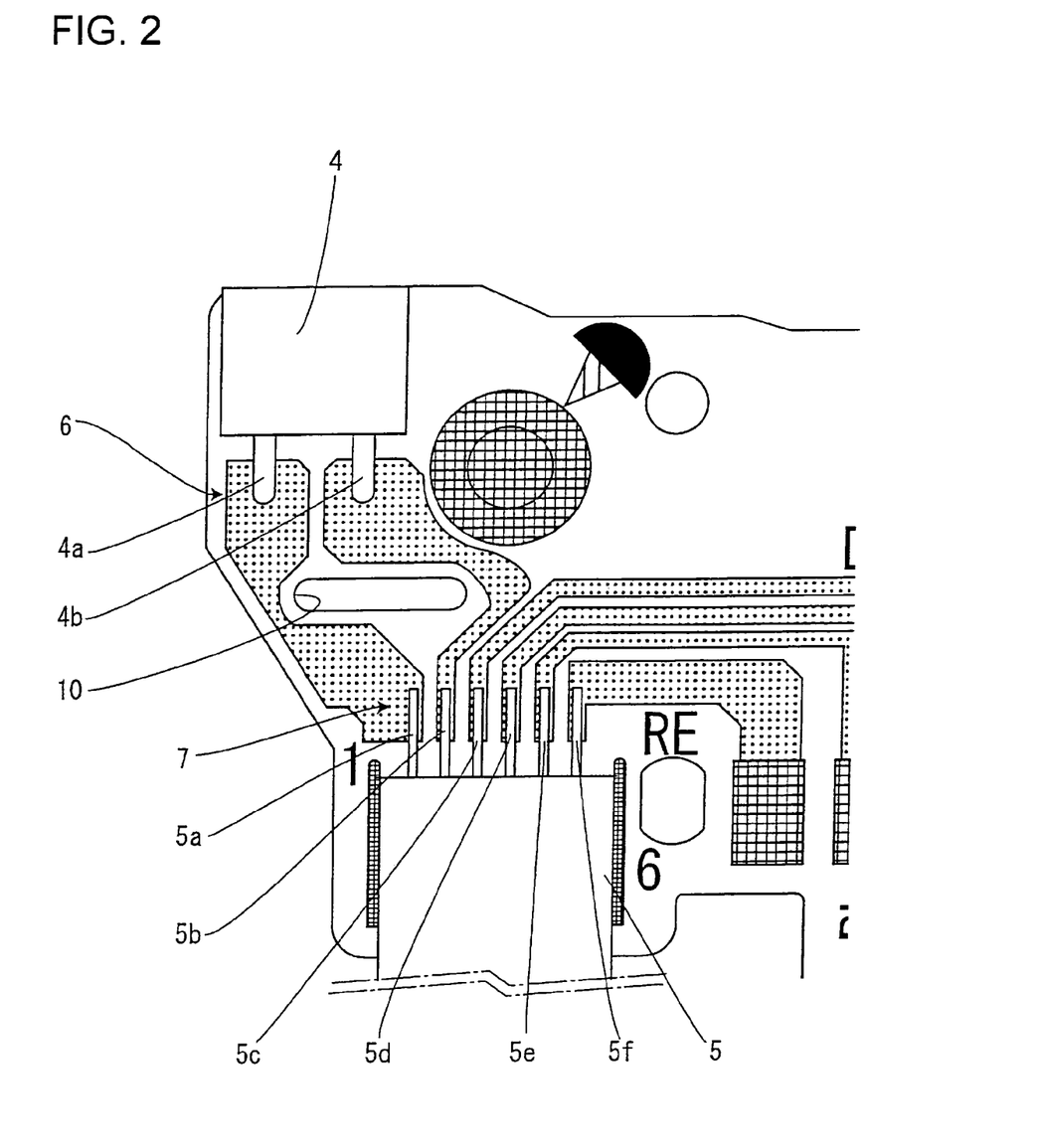
FIG. 2 is an enlarged front view of a main part of the circuit board showing a state in which a slide switch and a flat cable are soldered to land patterns.
Figure 3A:
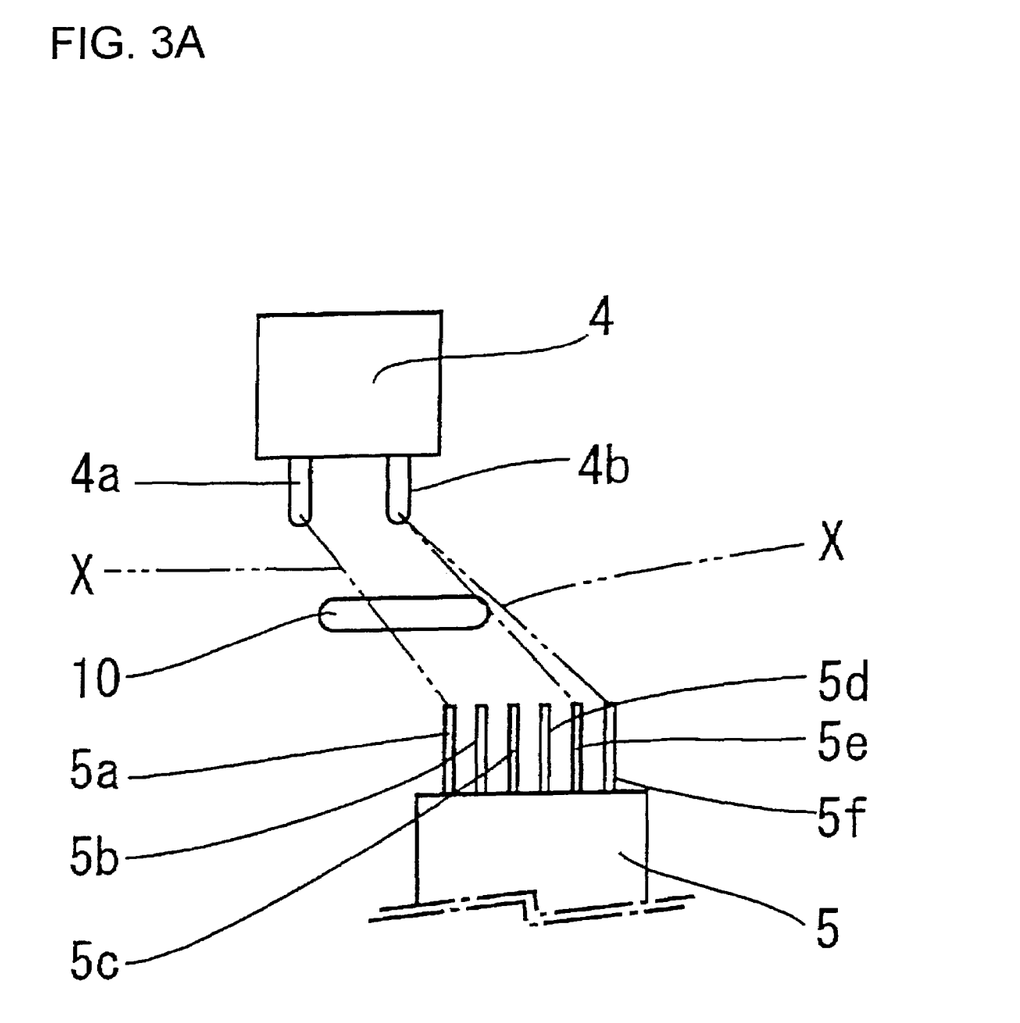
FIGS. 3A through 3C are explanatory diagrams showing positional relations of respective terminals in the slide switch and the flat cable of the circuit board of the invention.
Figure 3B:
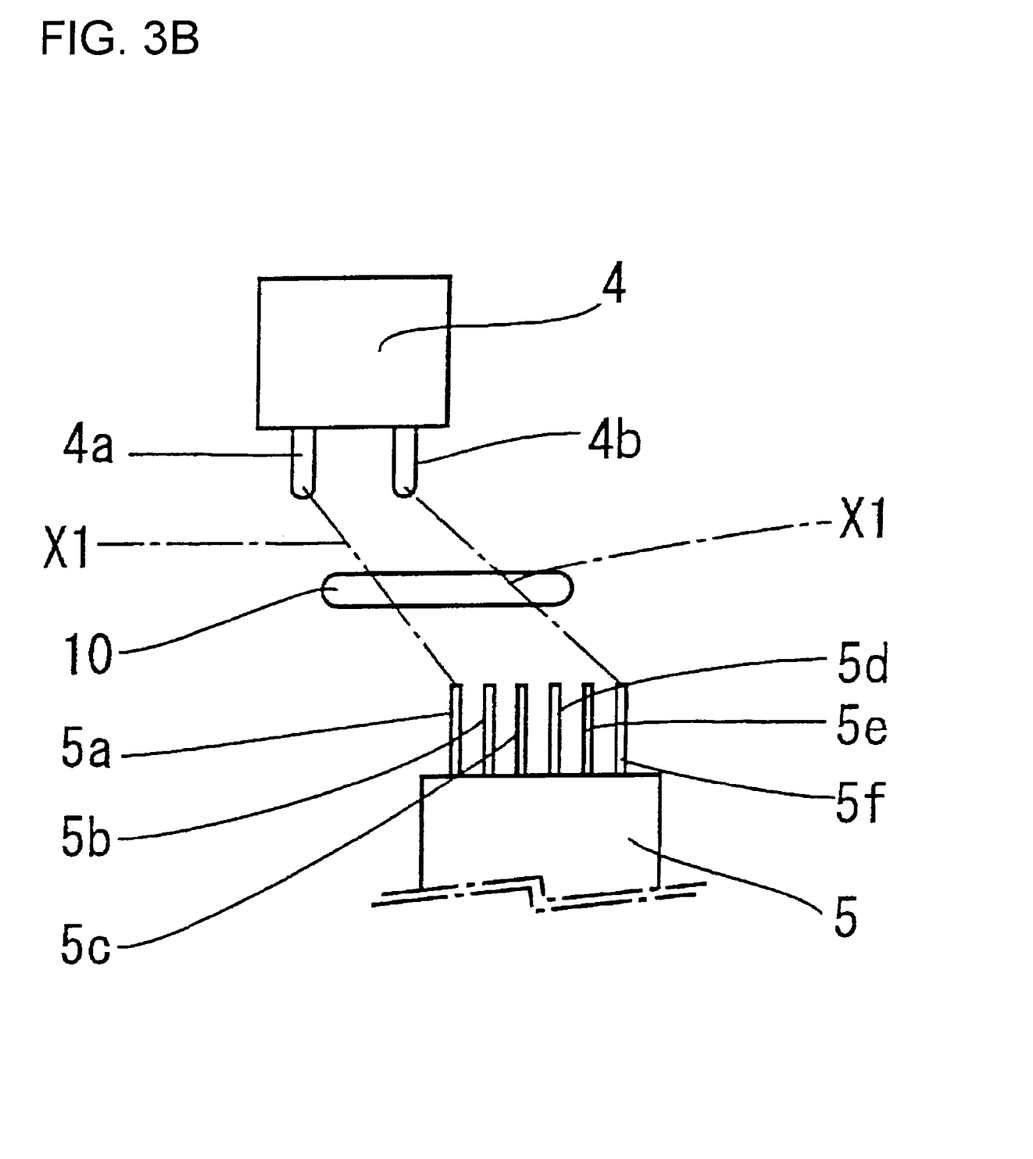
Figure 3C:
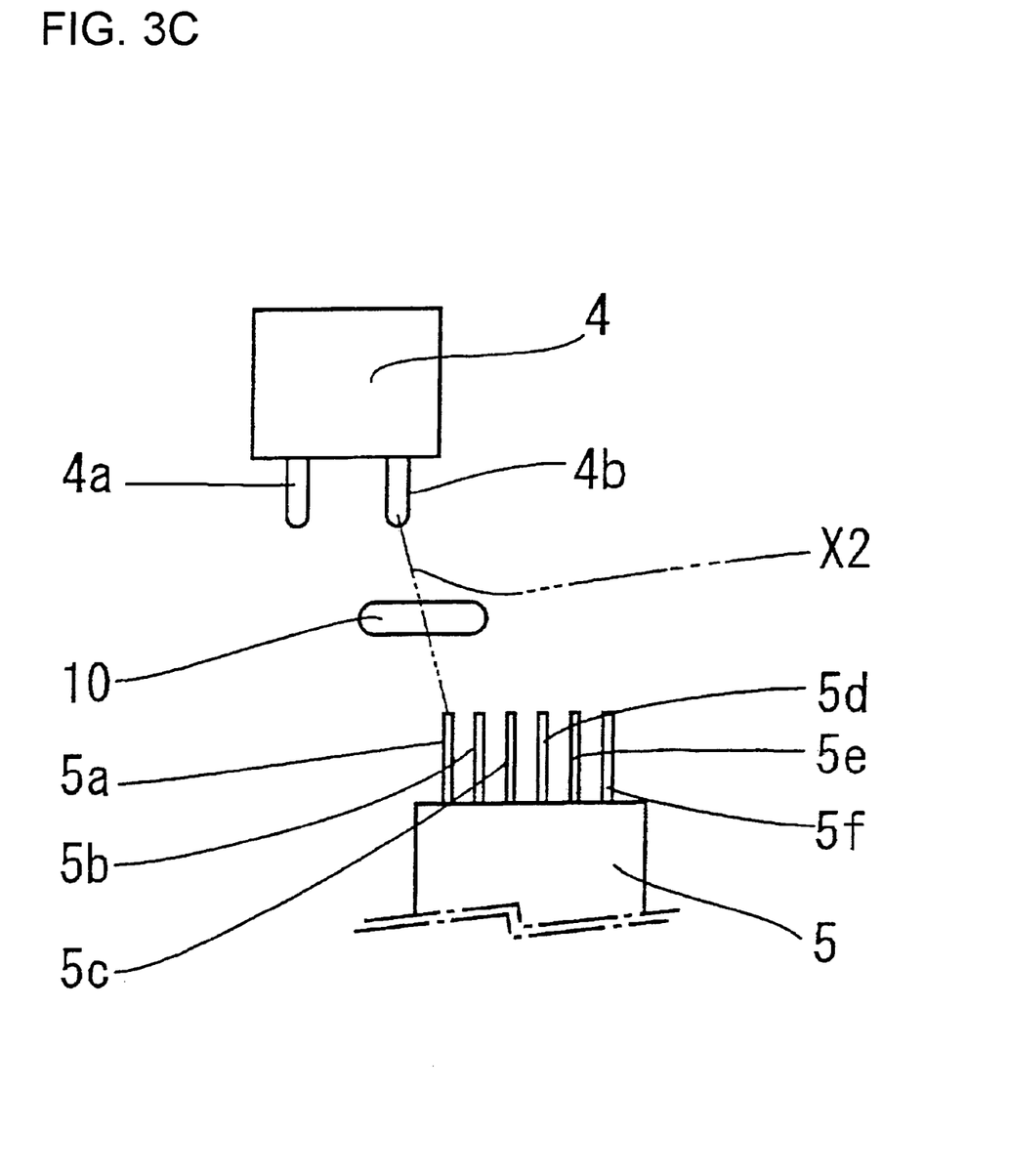

FIGS. 1 through 3 show one preferred embodiment of the present invention. In the figures, reference number 1 denotes a circuit board. In this embodiment, a plurality of the circuit boards 1 with an identical circuit structure are assembled to form one continuous large circuit board 1a for dividing the circuit boards 1 and subjecting the circuit boards 1 to multi-impression. After forming a circuit on this circuit board 1, an unnecessary portion of the circuit is removed by etching, whereby a wiring pattern 2 is formed on the circuit board 1. Thereafter, after applying plating to a necessary place of the circuit, a resist is printed in a portion, where soldering is unnecessary, by resist printing. In addition, a slide switch 4 and a flat cable 5 are mounted on the circuit board 1 as electronic components, and land patterns 6 and 7 for connecting the slide switch 4 and the flat cable 5 are formed on the wiring pattern 2. Please note that, in this embodiment, the land patterns 6 and 7 are formed in an uneven shape to be close to each other, the flat cable 5 including six terminals 5a to 5f, and the slide switch 4 including two terminals 4a and 4b. The slide switch 4 is soldered to the land pattern 6 by an automatic soldering machine or the like, and the flat cable 5 is soldered to the land pattern 7 after the circuit board is manufactured.

Reference number 10 denotes a slit or opening that is formed between the land patterns 6 and 7. As shown in FIG. 3B, it is desirable to form this slit 10 so as to cross two imaginary lines X1 (indicated by two alternate long and short dash lines in FIG. 3B) which connect terminals 4a and 5a and terminals 4b and 5f positioned at both ends of the slide switch 4 and the flat cable 5, respectively. However, the slit 10 can be formed so as to at least cross an imaginary line X2 (indicated by an alternate long and three short dash line in FIG. 3C) which connect the closest terminals 4b and 5a of the slide switch 4 and the flat cable 5. Please note that, in this embodiment, the slit 10 is formed so as to cross two imaginary lines X (indicated by a long and two short dash lines in FIG. 3A) connecting five terminals 5a to 5e excluding a terminal 5f, which is most distant from the terminal 4b of the slide switch 4 connected to the land pattern 6 in advance, and the two terminals 4a and 4b.

According to this arrangement as described above, the slide switch 4 is soldered to the land pattern 6 in advance, and the terminals 5a to 5f of the flat cable 5 are soldered to the land pattern 7 after the circuit board is manufactured. At this point, flux is produced by soldering the flat cable 5. However, since the slit 10 is formed between the land patterns 6 and 7 so as to cross the imaginary lines X connecting the five terminals 5a to 5e excluding the most distant terminal 5f and the terminals 4a and 4b, the flux can escape from the slit 10 and does not intrude into the slide switch 4 easily. In other words, since the terminal 5f of the flat cable 5 and the terminal 4b of the slide switch 4 are arranged in positions relatively distant from each other, the flux produced at the time of soldering of the terminal 4f does not reach the slide switch 4 easily and affect the slide switch 4 much. In this way, if the slit 10 is at least formed in a place between the terminals 5a to 5e and the terminals 4a and 4b where the flux easily intrudes into the slide switch 4, it is possible to effectively prevent the flux, which is produced when the flat cable 5 is soldered after the circuit board is manufactured, from intruding into the slide switch 4. Consequently, it is possible to prevent failures of the slide switch 4 such as electrolytic etching and deterioration in insulation due to the flux. In addition, by setting a length of the slit 10 to a necessary minimum length, it is possible to mount electronic components on the circuit board 1 at a high density and reduce a size of the circuit board 1. Moreover, a degree of freedom of design of patterns is also improved and heat or a foreign material, which is produced when the flat cable 5 is soldered, is also prevented from traveling to the slide switch 4 easily by a space portion formed by the slit 10. Thus, it is possible to prevent an adverse effect caused on the slide switch 4 by the heat or the foreign material.

Figure 4:
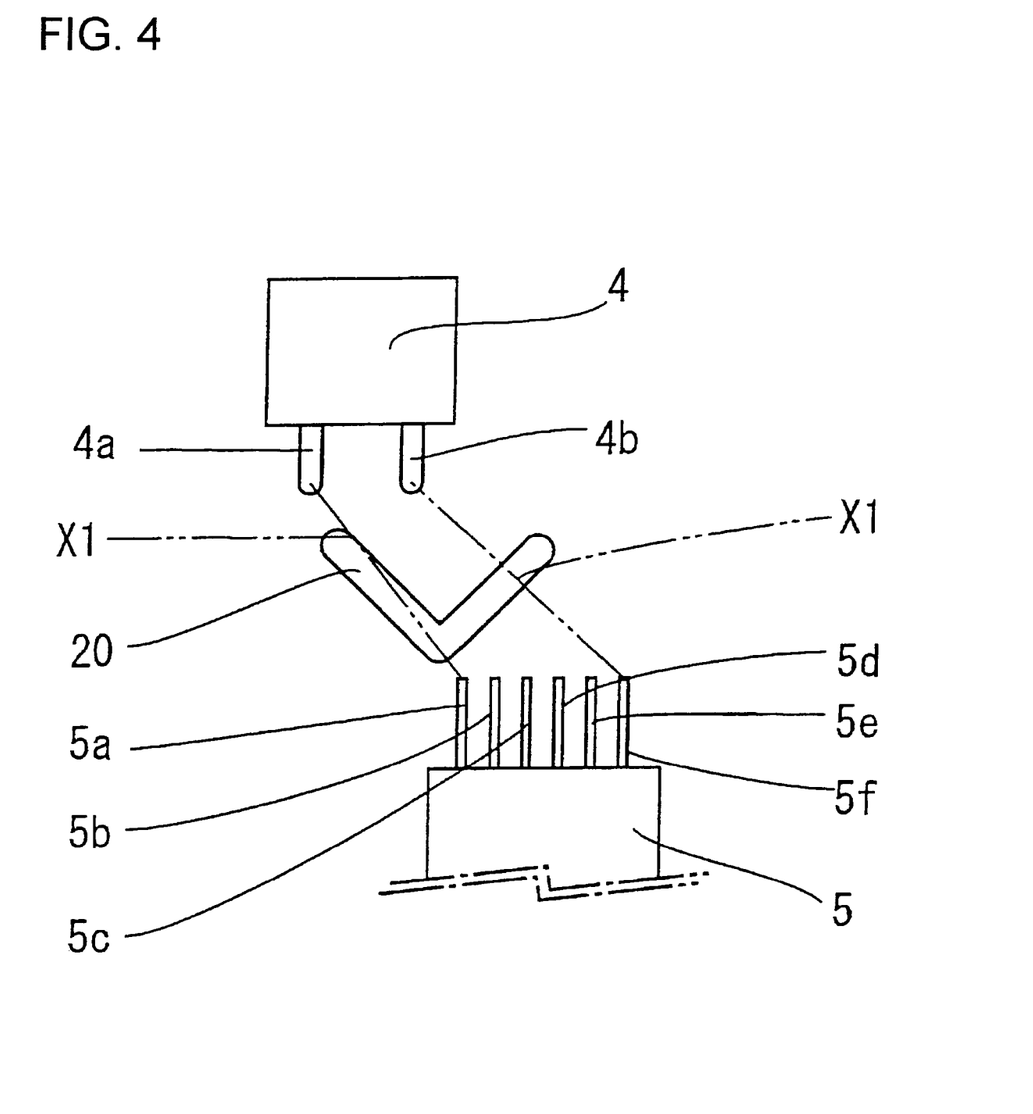
FIG. 4 is an explanatory diagram showing a modification of a slit of the invention in which the slit is formed in a V shape.
Figure 5:
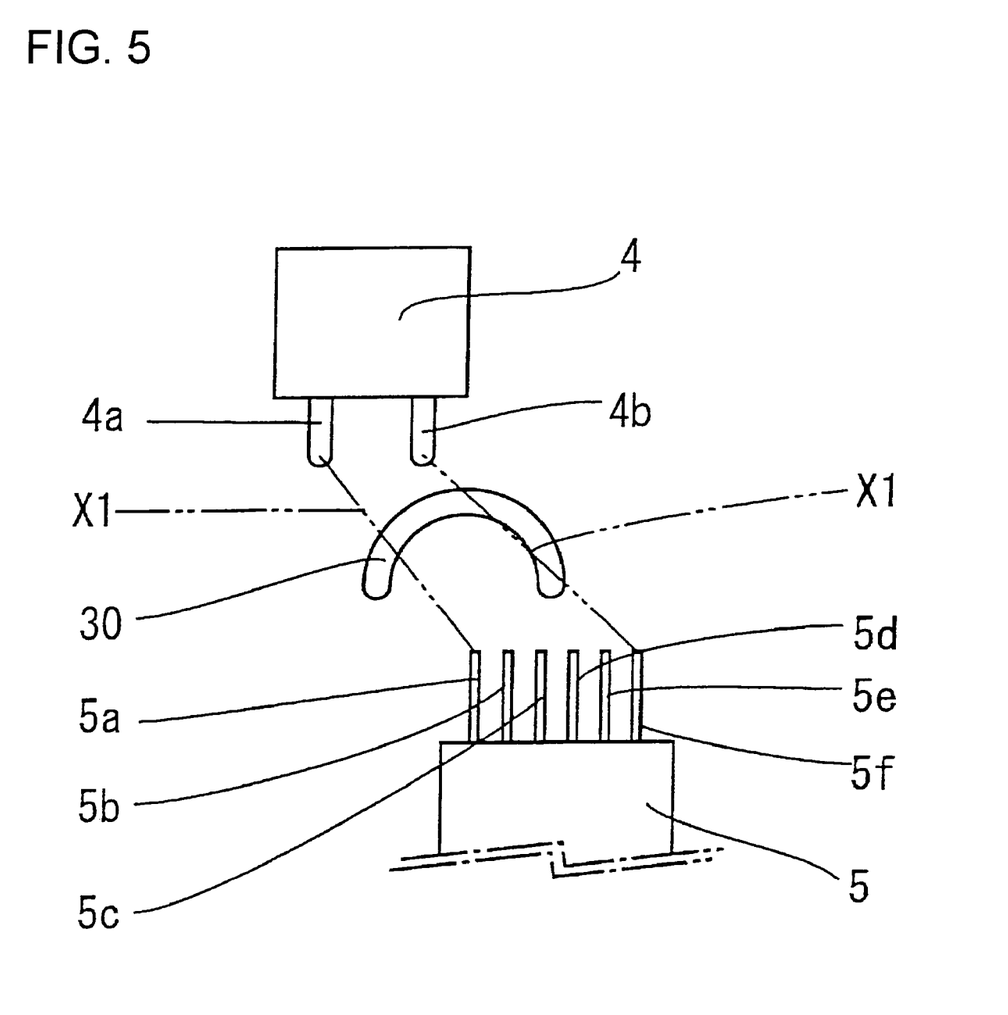
FIG. 5 is an explanatory diagram showing a modification of the slit of the invention in which the slit is formed in a semicircular shape.
Figure 6:
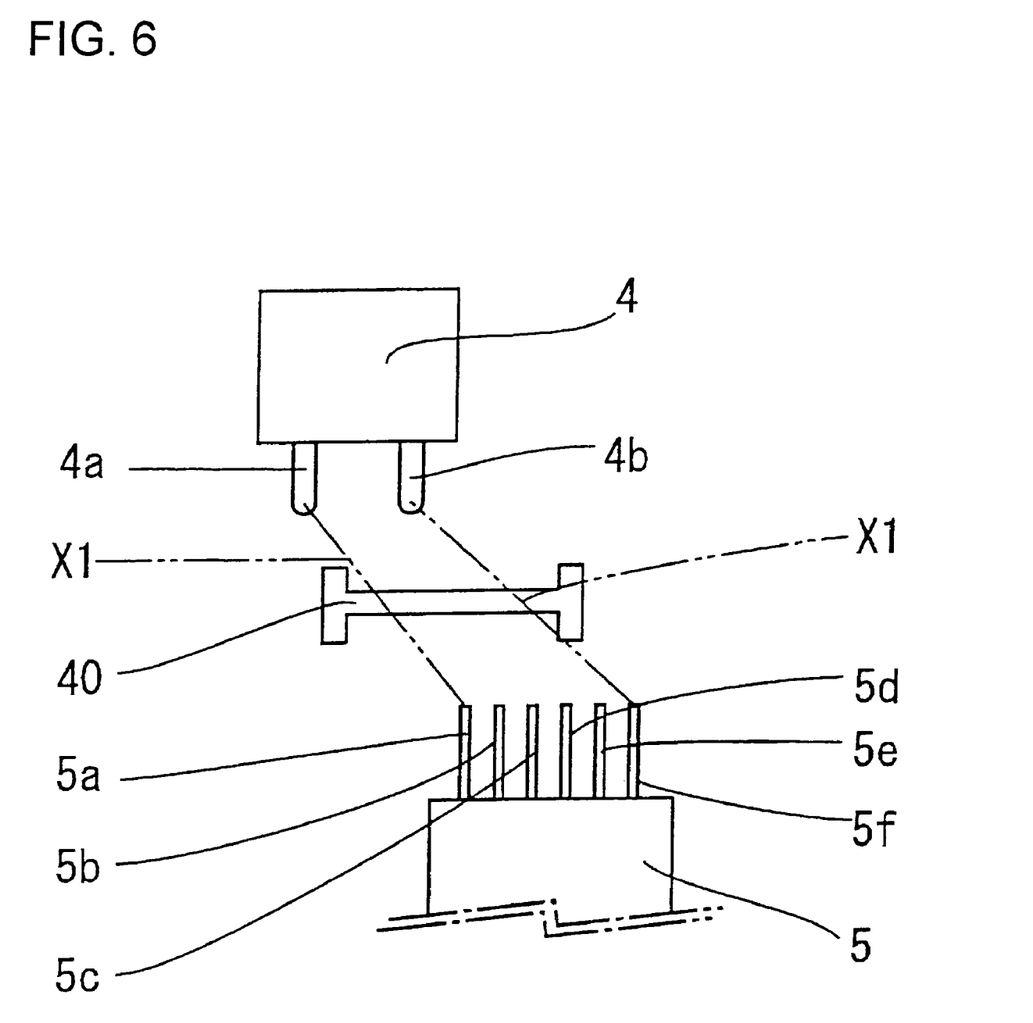
FIG. 6 is an explanatory diagram showing a modification of the slit of the invention in which the slit is formed in an H shape.
Figure 7:
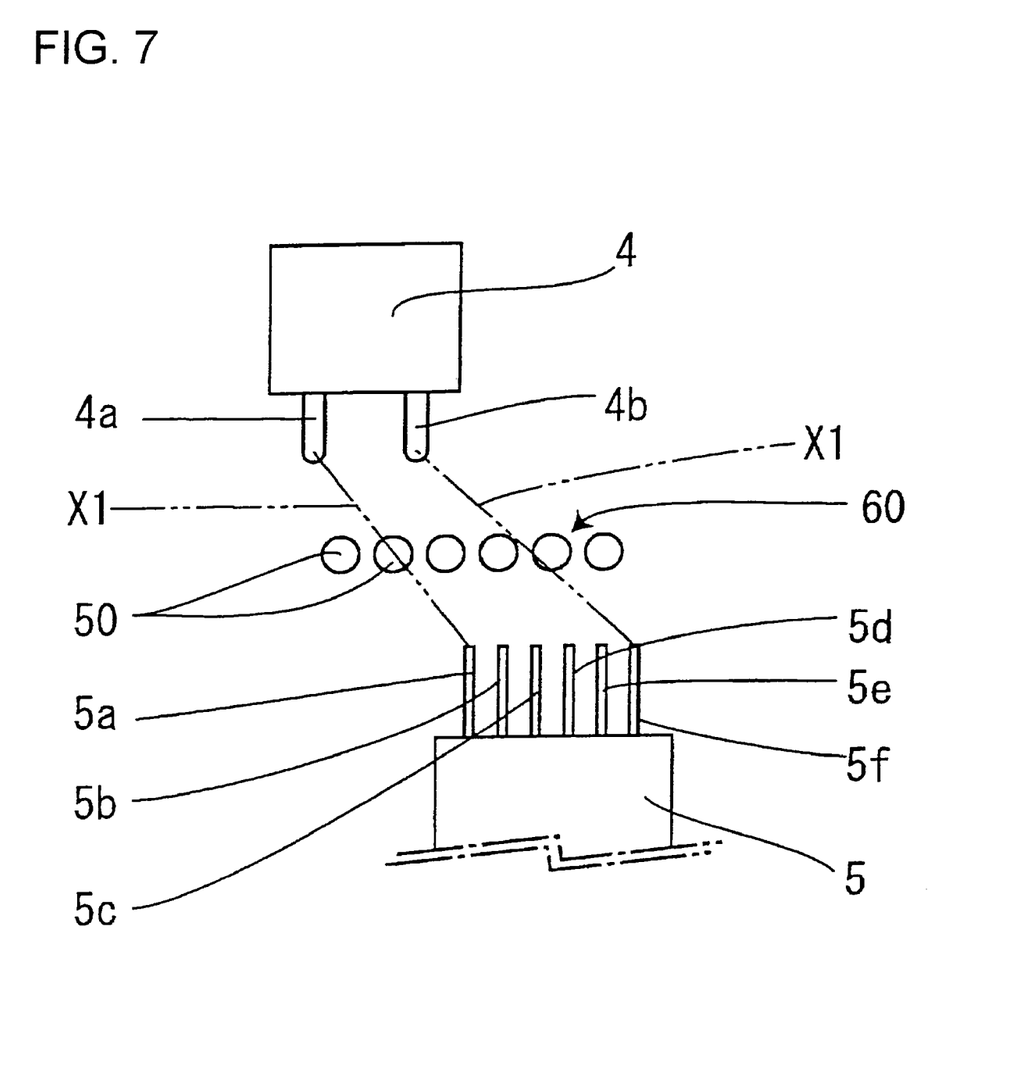
FIG. 7 is an explanatory diagram showing a modification of the slit of the invention in which the slit is formed discontinuously.

As described above, the embodiment of the invention has been described in detail, however, please note that the invention is not limited to the embodiment and various modifications are possible within the scopes of the invention. For example, a shape of the slit 1 is not limited to a linear shape. As shown in FIGS. 4 through 6, a slit 20 of a V shape, a slit 30 of a semicircular shape, or a slit 40 of an H shape may be formed and a shape of a slit only has to be selected according to the circumstances. Moreover, a form of the slit 1 is not limited to a continuous slit, and a discontinuous slit 60 may be formed by placing circular holes 50 close to one another as shown in FIG. 7. The electronic components to be mounted on the circuit board 1 are not limited to the flat cable 5 and the slide switch 4 and various electronic components are applicable as the electronic components, and the number of terminals only has to be selected according to circumstances as well.

What is claimed is:

1. A circuit board on which land patterns for soldering plural terminals of plural electronic components mounted on the circuit board are provided apart from one another, wherein one terminal of one electronic component among the plural electronic components and one terminal of another electronic component are soldered to the respective land patterns, whereby the respective terminals of the one electronic component and the another electronic component are electrically connected, and slits as openings are provided between the respective land patterns of the one terminal of the one electronic component and the one terminal of the another electronic component electrically connected thereto.

2. A circuit board on which land patterns for soldering plural terminals of plural electronic components mounted on the circuit board are provided apart from one another, wherein one terminal of one electronic component among the plural electronic components and one terminal of another electronic component are soldered to the respective land patterns, whereby the respective terminals of the one electronic component and the another electronic component are electrically connected, and slits as openings, which are located between the respective land patterns of the one terminal of the one electronic component and the one terminal of the another electronic component connected thereto are provided to permit flux produced at the time of the soldering the respective terminals of the one electronic component and the another electronic component to the respective land patterns to escape.

3. A circuit board on which land patterns for soldering terminals of plural electronic components mounted on the circuit board are provided apart from one another, wherein the electronic components include plural terminals, respectively, one terminal of one electronic component among the plural electronic components and one terminal of another electronic component are soldered to the respective land patterns, whereby the respective terminals of the one electronic component and the another electronic component are electrically connected, and slits as openings are provided between the land patterns for soldering terminals of the one electronic component and the another electronic component, and the slits as the openings are provided so as to at least cross imaginary lines connecting terminals closest to one another among the respective electrically connected electronic components.

* * * * *